United States Patent [19]
Rahman

[11] Patent Number: 6,043,002
[45] Date of Patent: Mar. 28, 2000

[54] METAL ION REDUCTION IN NOVOLAK RESIN SOLUTION USING AN ANION EXCHANGE RESIN

[75] Inventor: M. Dalil Rahman, Flemington, N.J.

[73] Assignee: Clariant Finance (BVI) Limited, Virgin Islands (Br.)

[21] Appl. No.: 08/902,442

[22] Filed: Jul. 29, 1997

Related U.S. Application Data

[62] Division of application No. 08/294,453, Aug. 23, 1994, Pat. No. 5,686,561.

[51] Int. Cl.[7] .......................................................... G03F 7/00
[52] U.S. Cl. ............................................ 430/326; 430/322
[58] Field of Search ..................................... 430/311, 322, 430/330, 326, 327, 168, 190, 191, 192, 193, 194; 528/482

[56] References Cited

U.S. PATENT DOCUMENTS

| | | | |
|---|---|---|---|
| 4,033,909 | 7/1977 | Papa | 260/2.5 F |
| 4,636,540 | 1/1987 | Warfel | 523/310 |
| 5,073,622 | 12/1991 | Wojtech et al. | 528/486 |

FOREIGN PATENT DOCUMENTS

| | | |
|---|---|---|
| 1509354 | 5/1978 | United Kingdom . |
| WO 94/12912 | 6/1994 | WIPO . |
| WO 94/14858 | 7/1994 | WIPO . |
| WO 94/14863 | 7/1994 | WIPO . |

OTHER PUBLICATIONS

"Amberlite Ion Exchange Resins Laboratory Guide", Rohm and Haas Company, Philadelphia, PA, 19105, pp. 5–7, Sep. 1979.

*Primary Examiner*—Kathleen Duda
*Attorney, Agent, or Firm*—Andrew F. Sayko Jr

[57] ABSTRACT

The present invention provides methods for producing water insoluble, aqueous alkali soluble novolak resins having a very low level of metal ions, utilizing a specially treated anion exchange resin. A method is also provided for producing photoresist composition having a very low level of metal ions from such novolak resins and for producing semiconductor devices using such photoresist compositions.

12 Claims, No Drawings

METAL ION REDUCTION IN NOVOLAK RESIN SOLUTION USING AN ANION EXCHANGE RESIN

This application is a division of application Ser. No. 08/294,453 filed Aug. 23, 1994 which application is now U.S. Pat. No. 5,686,561.

BACKGROUND OF THE INVENTION

The present invention relates to a process for producing novolak resins having a very low level of metal ions, especially sodium and iron, and for using such novolak resins in light-sensitive compositions. The present invention also relates to a process for making light-sensitive compositions useful in positive-working photoresist compositions. Further, the present invention relates to a process for coating substrates with these light-sensitive compositions as well as the process of coating, imaging and developing these light-sensitive mixtures on substrates.

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation-exposed or the unexposed areas of the coated surface of the substrate.

Metal contamination has been a problem for a long time in the fabrication of high density integrated circuits and computer chips, often leading to increased defects, yield losses, degradation and decreased performance. In plasma processes, metals such as sodium and iron, when they are present in photoresists, can cause contamination especially during plasma stripping. However, these problems have been overcome to a substantial extent during the fabrication process. For example, by utilizing HCL gettering of the contaminants during a high temperature anneal cycle.

As semiconductor devices have become more sophisticated, these problems have become much more difficult to overcome. When silicon wafers are coated with a liquid positive photoresist and subsequently stripped off, such as with oxygen microwave plasma, the performance and stability of the semiconductor device is often seen to decrease. As the plasma stripping process is repeated, more degradation of the device frequently occurs. A primary cause of such problems has been found to be the metal contamination in the photoresist, particularly sodium and iron ions. Metal levels of less than 1.0 ppm in the photoresist have been found to adversely affect the properties of such semiconductor devices.

Novolak resins are frequently used a polymeric binder in liquid photoresist formulations. These resins are typically produced by conducting a condensation reaction between formaldehyde and one or more multi-substituted phenols, in the presence of an acid catalyst, such as oxalic acid. In producing sophisticated semiconductor devices, it has become increasingly important to provide novolak resins having metal contamination levels well below 1.0 ppm.

There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating. Thereby uncovering a desired portion of the underlying substrate surface on which the photoresist composition was deposited. On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying substrate surface is uncovered.

After this development operation, the now partially unprotected substrate may be treated with a substrate-etchant solution or plasma gases and the like. The etchant solution or plasma gases etch that portion of the substrate where the photoresist coating was removed during development. The areas of the substrate where the photoresist coating still remains are protected and, thus, an etched pattern is created in the substrate material which corresponds to the photomask used for the image-wise exposure of the radiation. Later, the remaining areas of the photoresist coating may be removed during a stripping operation, leaving a clean etched substrate surface. In some instances, it is desirable to heat treat the remaining photoresist layer, after the development step and before the etching step, to increase its adhesion to the underlying substrate and its resistance to etching solutions.

Positive working photoresist compositions are currently favored over negative working resists because the former generally have better resolution capabilities and pattern transfer characteristics. Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate.

SUMMARY OF THE INVENTION

The present invention relates to a process for producing water insoluble, aqueous alkali soluble novolak resins containing very low levels of metal ions, especially sodium and iron, and a process for their use in photoresist compositions. The invention further relates to a process for making positive-working photoresists containing these novolak resins and a photosensitizer, and a process for using such photoresists in producing semiconductor devices.

The novolak resins obtained have very low levels of metal ions such as iron, sodium, potassium, calcium, magnesium, copper and zinc. Sodium and iron are the most common metal ion contaminants and among the easiest to detect. The level of these metal ions serves as an indicator of the level of other metal ions. The level of sodium and iron ions are each less than 100 ppb, preferably less than 50 ppb and most preferably less than 20 ppb.

Water insoluble, aqueous alkali soluble novolak resins having a very low levels of metal ions may be obtained by condensing formaldehyde having a very low level of metal ions with one or more phenolic compounds, such as m-cresol, p-cresol, 3,5-dimethyl phenol or 3,5-xylenol, having a very low level of metal ions. The condensation reaction is preferably carried out in the presence of an acid catalyst, such as oxalic acid or maleic anhydride.

Water insoluble, aqueous alkali soluble novolak resins having a very low level of metal ions are obtained according to the process of the present invention by utilizing an anion exchange resin to purify such novolak resins. In the process of the present invention, an anion exchange resin is unexpectedly effective for removing cations. Generally, an anion exchange resin is used to remove anions, especially acid anions such as $Cl^-$, $SO_4^{-2}$, $CH_3COO^-$, etc.

U.S. Pat. No. 5,073,622 discloses a process for producing novolak resins having a sodium and iron ion level of less than 500 ppb by dissolving the novolak resin in an organic solvent and contacting the solution with aqueous solutions of an acidic complex forming compound.

The claimed invention differs from that process in that instead of a solution of a complex forming agent it utilizes a basic anion exchange resin which is pretreated a) with water and a mineral acid solution, b) with deionized (DI) water, c) with ammonium hydroxide solution, d) with DI water, and e) with a solvent which is the same as or at least compatible with the novolak resin solvent, to remove substantially all of the water, and provide an anion exchange resin having a metal ion level, e.g. sodium and iron, of less than 300 ppb each, perferably less than 200 ppb each, more preferably less than 100 ppb each, most preferably no more than 50 ppb each.

DETAILED DESCRIPTION OF THE PREFERRED EMBODIMENT

The present invention provides a process for producing water insoluble, alkali soluble novolak resins having a very low level of metal ions, particularly sodium and iron. In one embodiment, the process utilizes a basic anion exchange resin to purify the novolak resin solution, e.g. a 2–50% solution in propylene glycol methyl ether acetate (PGMEA). The subject process comprises:

a) washing an anion exchange resin with water, preferably DI water, followed by washing with a mineral acid solution (preferably a 5–98% solution of sulfuric, nitric or hydrochloric acid), washing again with water, preferably DI water, followed by washing with an ammonium hydroxide solution (preferably a 2–28% solution), followed by washing with DI water, and thereby reducing the level of sodium and iron ions in the anion exchange resin to less than 200 ppb each, preferably less than 100 ppb each and most preferably no more than 50 ppb each;

b) preparing a solution of a novolak resin in a suitable novolak resin solvent;

c) washing the anion exchange resin with a solvent which is the same as, or at least compatible with, the novolak resin solvent, to remove substantially all of the water; and d) passing a solution of novolak resin through the washed anion exchange resin bed at a flow rate such that the residence time is greater than about 10 minutes, preferably more than about 60 minutes, more preferably higher than about 100 minutes, and most preferably more than about 200 minutes and thereby reducing the level of sodium and iron ions in the novolak resin solution to less than 100 ppb each, preferably less than 50 ppb each and most preferably less than 20 ppb each.

The present invention further provides a process for producing a positive photoresist composition having a very low level of sodium and iron ions. The subject process comprises:

a) washing an anion exchange resin with water, preferably DI water, followed by washing with a mineral acid solution (preferably a 5–98% solution of sulfuric, nitric or hydrochloric acid), washing again with water, preferably DI water, followed by washing with an ammonium hydroxide solution (preferably a 2–28% solution), followed by washing with DI water, and thereby reducing the level of sodium and iron ions in the anion exchange resin to less than 200 ppb each, preferably less than 100 ppb each and most preferably no more than 50 ppb each;

b) preparing a solution of a novolak resin in a suitable novolak resin solvent;

c) washing the anion exchange resin with a solvent which is the same as, or at least compatible with, the novolak resin solvent, to remove substantially all of the water;

d) passing a solution of novolak resin through the washed anion exchange resin bed at a flow rate such that the residence time is higher than 500 minutes, preferably greater than 60 minutes, and most preferably more than 100 minutes and thereby reducing the level of sodium and iron ions in the solution to less than 100 ppb each, more preferably less than 50 ppb each and most preferably less than 20 ppb each; and e) producing a photoresist composition by providing an admixture of: 1) a photosensitive component in an amount sufficient to photosensitize the photoresist composition; 2) the novolak resin having a low level of metal ions and 3) a suitable photoresist solvent.

The invention further provides a method for producing a semiconductor device by producing a photo-image on a substrate by coating a suitable substrate with a positive working photoresist composition by:

a) washing an anion exchange resin with water, preferably DI water, followed by washing with a mineral acid solution (preferably a 5–98% solution of sulfuric, nitric or hydrochloric acid), washing again with water, preferably DI water, followed by washing with an ammonium hydroxide solution (preferably a 2–28% solution), followed by washing with DI water, and thereby reducing the level of sodium and iron ions in the anion exchange resin to less than 200 ppb each, preferably less than 100 ppb each and most preferably no more than 50 ppb each;

b) preparing a solution of a novolak resin in a suitable novolak resin solvent;

c) washing the anion exchange resin with a solvent which is the same as, or at least compatible with, the novolak resin solvent, to remove substantially all of the water;

d) passing a solution of novolak resin through the washed anion exchange resin bed with at a flow rate such that the residence time is greater than 10 minutes, preferably higher than 60 minutes, more preferably greater than 100 minutes and most preferably more than 100 minutes and thereby reducing the level of sodium and iron ions in the solution to less than 100 ppb each, preferably less than 50 ppb each and most preferably less than 20 ppb each;

e) producing a photoresist composition by providing an admixture of: 1) a photosensitive component in an amount sufficient to photosensitive the photoresist composition; 2) the novolak resin having a low level of sodium and iron ions and 3) a suitable photoresist solvent; and f) heat treating the coated substrate until substantially all solvent is removed; image-wise exposing the photosensitive composition and removing the image-wise exposed areas of such composition with a suitable developer, such as an aqueous alkaline developer. Optionally one may perform a baking of the substrate either immediately before or after the removing step.

It has been found that a novolak resin containing very low levels of metal ion contamination cannot be obtained by first condensing formaldehyde with one or more phenolic compounds, in the presence of an acid catalyst, and then removing the metal ions from the resin using an anion exchange unless: 1) the novolak resin in placed in a solution using a suitable solvent; 2) the anion exchange resin is treated with water and a mineral acid solution, ammonium hydroxide solution and water as described above to substantially reduce the level of metal ions; 3) the ion exchange resin is then thoroughly rinsed with a solvent which is the same as or at least compatible with, the novolak resin solvent to remove substantially all of the water; 4) the novolak resin solution is then passed through the anion ion exchange resin at a very slow rate.

An anion exchange resin, such as a styrene/divinylbenzene anion exchange resin is utilized in the present process. Such anion exchange resins are available from Rohm and Haas Company, e.g. AMBERLYST® 21 or AMBERLYST® 26 resin. These resins typically contain as much as 80,000 to 200,000 ppb of sodium and iron. Before being utilized in the process of the invention, the anion exchange resin must be washed with water and then a mineral acid solution, with water again, ammonum hydroxide solution and with DI water to substantially reduce the metal ion level. Preferably the anion exchange resin is initially rinsed with DI water, followed by a mineral acid solution such as a 10 percent sulfuric acid solution, rinsed again with DI water, rinsed again with the mineral acid solution and once again rinsed with DI water. The resin is then washed with ammonium hydroxide solution, followed by washing with DI water. When purifying novolak resin solution, it is critical that the anion exchange resin is finally rinsed with a solvent which is the same as, or at least compatible with, the novolak resin solvent, to remove substantially all of the water.

The novolak resin may be passed through a column containing the washed anion exchange resin as a solution, e.g a solution of about 40 percent novolak resin in PGMEA. Such solutions typically contain from 250 to 1000 ppb or more of each of sodium and iron ions. During the process of the present invention, these levels are each reduced to as low as 10 ppb each.

In the present invention the passing of a novolak solution through an anion exchange column must maintain a rate of flow such that the residence time (which is the total bed volume devided by flow of rate) is high, i.e. greater than about 10 minutes up to greater than 200 minutes.

The present invention provides a process for producing a photoresist composition and a process for producing semiconductor devices using such photoresist composition. The photoresist composition is formed by providing an admixture of a photosensitizer, the subject novolak resin and a suitable solvent. Suitable solvents for such photoresists and for water insoluble, aqueous alkali soluble novolak resins include propylene glycol mono-alkyl ether, propylene glycol alkyl (e.g. methyl) ether acetate, ethyl-3-ethoxypropionate, ethyl lactate, mixtures of ethyl-3-ethoxypropionate and ethyl lactate, butyl acetate, xylene, diglyme, 2-heptanone, ethylene glycol monoethyl ether acetate. The preferred solvents are propylene glycol methyl ether acetate (PGMEA), ethyl lactate and ethyl-3-ethoxypropionate (EEP).

Other optional ingredients such as colorants, dyes, anti-striation agents, leveling agents, plasticizers, adhesion promoters, speed enhancers, solvents and such surfactants as non-ionic surfactants may be added to the solution of novolak resin, sensitizer and solvent before the photoresist composition is coated onto a substrate. Examples of dye additives that may be used together with the photoresist compositions of the present invention include Methyl Violet 2B (C.I. No. 42535), Crystal Violet (C.I. 42555). Malachite Green (C.I. No. 42000), Victoria Blue B (C.I. No. 44045) and Neutral Red (C.I. No. 50040) at one to ten percent weight levels, based on the combined weight of novolak and sensitizer. The dye additives help provide increased resolution by inhibiting back scattering of light off the substrate.

Anti-striation agents may be used at up to about a five percent weight level, based on the combined weight of novolak and sensitizer. Plasticizers which may be used include, for example, phosphoric acid tri-(beta-chloroethyl)-ester; stearic acid; dicamphor; polypropylene; acetal resins; phenoxy resins; and alkyl resins, at about one to ten percent weight levels, based on the combined weight of novolak and sensitizer. The plasticizer additives improve the coating properties of the material and enable the application of a film that is smooth and of uniform thickness to the substrate.

Adhesion promoters which may be used include, for example, beta-(3,4-epoxycyclohexyl)-ethyltrimethoxysilane; p-methyl-disilane-methyl methacrylate; vinyltrichlorosilane; and gamma-amino-propyl triethoxysilane up to about a 4 percent weight level, based on the combined weight of novolak and sensitizer. Development speed enhancers that may be used include, for example, picric acid, nicotinic acid or nitrocinnamic acid up to about a 20 percent weight level, based on the combined weight of novolak and sensitizer. These enhancers tend to increase the solubility of the photoresist coating in both the exposed and unexposed areas, and thus they are used in applications when speed of development is the overriding consideration even though some degree of contrast may be sacrificed; i.e., while the exposed areas of the photoresist coating will be dissolved more quickly by the developer, the speed enhances will also cause a larger loss of photoresist coating from the unexposed areas.

The solvents may be present in the overall composition in an amount of up to 95% by weight of the solids in the composition. Solvents, of course are substantially removed after coating of the photoresist solution on a substrate and drying.

The prepared photoresist solution, can be applied to a substrate by any conventional method used in the photoresist art, including dipping, spraying, whirling and spin coating. When spin coating, for example, the resist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds.

The photoresist coatings produced by the described procedure are particularly suitable for application to thermally grown silicon/silicon dioxide-coated wafers, such as are utilized in the production of microprocessors and other miniaturized integrated circuit components. An aluminum/ aluminum oxide wafer can also be used. The substrate may also comprise various polymeric resins, especially transparent polymers such as polyesters. The substrate may have an adhesion promoted layer of a suitable composition, such as one containing hexa-alkyl disilazane.

The photoresist composition solution is then coated onto the substrate, and the substrate is treated at a temperature from about 70° C. to about 110° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the photo-sensitizer. In general, one desires to minimize the concentration of solvents and this first temperature treatment is conducted until substantially all of the solvents have evaporated and a thin coating of photoresist composition, on the order of one micron in thickness, remains on the substrate. In a preferred embodiment the temperature is from about 85° C. to about 95° C. The treatment is conducted until the rate of change of solvent removal becomes relatively insignificant. The temperature and time selection depends on the photoresist properties desired by the user, as well as the equipment used and commercially desired coating times. The coating substrate can then be exposed to actinic radiation, e.g., ultraviolet radiation, at a wavelength of from about 300 nm to about 450 nm, x-ray, electron beam, ion beam or laser radiation, in any desired pattern, produced by use of suitable masks, negatives, stencils, templates, etc.

The photoresist is then optionally subjected to a post exposure second baking, or heat treatment, either before or after development. The heating temperatures may range from about 90° C. to about 120° C., more preferably from about 100° C. to about 110° C. The heating may be conducted for from about 30 seconds to about 2 minutes, more preferably from about 60 seconds to about 90 seconds on a hot plate or about 30 to about 45 minutes by convection oven.

The exposed photoresist-coated substrates are developed to remove the image-wise exposed areas by immersion in an alkaline developing solution or developed by spray development process. The solution is preferably agitated, for example, by nitrogen burst agitation. The substrates are allowed to remain in the developer until all, or substantially all, of the photoresist coating has dissolved from the exposed areas. Developers may include aqueous solutions of ammonium or alkali metal hydroxides. One preferred hydroxide is tetramethyl ammonium hydroxide. After removal of the coated wafers from the developing solution, one may conduct an optional post-development heat treatment or bake to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution. The photoresist compositions of the present invention are resistant to acid-base etching solutions and provide effective protection for the unexposed photoresist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLE 1

75 grams of Amberlyst® 21 anion exchange resin beads were placed in a conical flask and DI water was added so that all of the resin beads were under water. The flask was sealed and allowed to stand overnight to swell the resin beads. The next morning the water was decanted, more DI water added to cover the resin beads and the flask was shaken slowly. The water was again decanted. The rinsing with DI water and decanting steps were repeated three more times. The resulting slurry of anion exchange resin was poured into a glass column equipped with a porous disk and a stopcock. The resin was allowed to settle to the bottom and the column was back flushed with DI water for 25 minutes. The resin was again allowed to settle to the bottom.

The bed length was measured and the bed volume was calculated as 120 ml. A 10 percent sulfuric acid solution was passed down through the resin bed at a rate of about 10 ml./min. 6 bed volumes of the acid solution were passed through the resin bed. A sufficient amount of of DI water were then passed down through the resin bed at about the same flow rate, to remove the acid. An ammonium hydroxide solution (6%, 6 bed volumes) was then passed through the column at the same rate, followed by DI water (about 60 bed volumes) to remove the ammonium hydroxide. The pH of the effluent water was measured to assure that it matched the pH of 6 for fresh DI water. 2 bed volumes of electronic grade acetone was passed to remove the water, followed by 2 bed volumes of PGMEA to remove the acetone.

500 grams of a 30 percent solution of a m-cresol 5,5-xylenol and formaldehyde condensed novolak resin dissolved in PGMEA, containing about 33 ppb sodium and about 232 ppb iron, was passed down through the resin bed at a flow rate such that the residence time was 90 minutes. The resin solution obtained had a very low level of metal ions as follows: sodium—19 ppb, iron—47 ppb.

EXAMPLE 2

Example 1 was repeated and 300 grams of a 30 percent solution of the novolak resin of Example 1 dissolved in PGMEA, containing about 33 ppb sodium and about 311 ppb iron, was passed down through a resin bed prepared as in Example 1 at a flow rate such that the residence time was 90 minutes. The resin solution obtained had a very low level of metal ions as follows: sodium—19 ppb, iron—63 ppb.

EXAMPLE 3

Example 1 was repeated and 300 grams of a 30 percent solution of the novolak resin of Example 1 dissolved in PGMEA, containing about 33 ppb sodium and about 311 ppb iron, was passed down through a resin bed prepared as in Example 1 at a flow rate such that the residence time was 180 minutes. The resin solution obtained had a very low level of metal ions as follows: sodium—19 ppb, iron—43 ppb.

EXAMPLE 4

Photoresist solutions were prepared from a resin solution of the purified novolak resin of Example 1 dissolved in PGMEA by adding a mixed ester of trihydroxy phenylethane and 2,1,4- and 2,1,5-diazonapthoquinone sulfonyl chloride (RI 292) in such a way so that the photoresist solution contained 76% PGMEA and 24% total solids, of which 18% was RI 292 and 82% was novolak resin. The photoresist solutions were each spin coated, using standard techniques, onto quartz plates at a constant speed of about 4000 rpm to obtain layers of photoresist having an initial thickness of 1.1 micrometer (1.1 $\mu$m). The films were baked in a circulating air oven at 90° C. for 30 minutes. Ro and R were determined for each photoresist composition.

Ro was determined in a 0.263N TMAH developer (at 25+/−0.5° C.). Ro is the unexposed or dark film loss and was determined by placing the films in developer for 30 minutes and measuring the total film loss. Ro was reported as rate of film loss in Angstroms per minute.

R, the film loss rate of completely bleached film, was also determined in 0.263N TMAH developer (at 25+/−0.5° C.) for each photoresist formulation. The dose required to completely bleach each film was found by measuring the absorbance at 377 nanometers (nm) for 1.5 micrometer (1.5 $\mu$m) films on quartz plates after exposure to varying levels of radiation. R was calculated by measuring the time required to completely dissolve the 1.1 micrometer (1.1 $\mu$m) bleached films. R is also reported as Angstroms per minute.

The dose to clear was determined by exposing the 1.1 micrometer (1.1 $\mu$m) films to narrow band 365+/−10 nm radiation under an Optoline® gradient mask and calculating the energy required to obtain the first clear or completely developed step. All development was in 0.263 TMAH at 25+/−0.5° C. for 1 minute.

| | |
|---|---|
| Dose to clear | 80 mj/sq.cm |
| Dose to print | 155 mj/sq.cm |
| Resolution | 0.35 $\mu$m |
| Depth of focus | 0.4 $\mu$m |

I claim:

1. A method for producing a positive photoresist composition comprising:
   a) washing an anion exchange resin with water, followed by washing with a mineral acid solution, washing again with water, followed by washing with an ammonium hydroxide solution, followed by washing again with deionized water, and thereby reducing the level of sodium and iron ions in the anion exchange resin to less than 200 ppb each;
   b) preparing a solution of a novolak resin in a suitable novolak resin solvent;
   c) washing the anion exchange resin with a solvent which is the same as, or at least compatible with, the novolak resin solvent, to remove substantially all of the water;
   d) passing the solution of novolak resin through the washed anion exchange resin from step c) at a flow rate such that the residence time is more than 20 minutes, and thereby reducing the level of sodium and iron ions in the solution to less than 100 ppb each; and
   e) producing a photoresist composition by providing an admixture of; 1) a photosensitive component in an amount sufficient to photosensitize the photoresist composition; 2) the novolak resin from step d) and 3) a suitable photoresist solvent.

2. The method of claim 1 wherein said anion exchange resin in step a) is washed to reduce the sodium and iron level to less than 100 ppb each.

3. The method of claim 1 wherein said photoresist solvent is selected from the group consisting of propylene glycol methyl ether acetate, ethyl lactate and ethyl-3-ethoxypropionate.

4. A method for producing a semiconductor device by producing a photo-image on a substrate by coating a suitable substrate with a positive working photoresist composition by:
   a) washing an anion exchange resin with water, followed by washing with a mineral acid solution, washing again with water, followed by washing with an ammonium hydroxide solution, followed by washing with deionized water, and thereby reducing the level of sodium and iron ions in the anion exchange resin to less than 200 ppb each;
   b) preparing a solution of a novolak resin in a suitable novolak resin solvent;
   c) washing the anion exchange resin with a solvent which is the same as, or at least compatible with, the novolak resin solvent, to remove substantially all of the water;
   d) passing the solution of novolak resin through the washed anion exchange resin from step c) at a flow rate such that the residence time is more than 20 minutes and thereby reducing the level of sodium and iron ions in the solution to less than 100 ppb each;
   e) producing a photoresist composition by providing an admixture of; 1) a photosensitive component in an amount sufficient to photosensitize the photoresist composition; 2) the novolak resin from step d) and 3) a suitable photoresist solvent;
   f) coating the photoresist composition on a substrate;
   g) heat treating the coated substrate until substantially all of the photoresist solvent is removed; and
   h) image-wise exposing the photoresist composition and removing the image-wise exposed areas of the photoresist composition with a suitable developer.

5. The method of claim 4 wherein said developer comprises an aqueous alkaline developer.

6. The method of claim 4 further comprising the step of baking the coated substrate immediately before or after the removing step.

7. The method of claim 4 wherein the sodium and iron ion level of the novolak resin is reduced to less than 50 ppb each.

8. The method of claim 4 wherein said anion exchange resin in step a) is washed to reduce the sodium and iron level to less than 100 ppb each.

9. The method of claim 4 wherein said novolak resin produced has a sodium and iron ion level of less than 20 ppb each.

10. The method of claim 4 wherein said photoresist solvent is selected from the group consisting of propylene glycol methyl ether acetate, ethyl lactate and ethyl-3-ethoxypropionate.

11. The method of claim 4 wherein the novolak resin solvent and the solvent used for washing said ion exchange resin are identical.

12. The method of claim 4 wherein the novolak resin solvent, the solvent used for washing said ion exchange resin and the solvent for said photoresist composition are all identical.

* * * * *